(12) United States Patent
Zhang et al.

(10) Patent No.: US 11,483,011 B2
(45) Date of Patent: Oct. 25, 2022

(54) DECODING METHOD, DECODING DEVICE, AND DECODER

(71) Applicant: ZTE Corporation, Shenzhen (CN)

(72) Inventors: He Zhang, Shenzhen (CN); Xiong Tang, Shenzhen (CN); Wei Zhang, Shenzhen (CN); Chaozheng Chen, Shenzhen (CN); Xiaoliang Li, Shenzhen (CN); Zouzhang Wen, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 17/296,122

(22) PCT Filed: Nov. 13, 2019

(86) PCT No.: PCT/CN2019/117991
§ 371 (c)(1),
(2) Date: May 21, 2021

(87) PCT Pub. No.: WO2020/108306
PCT Pub. Date: Jun. 4, 2020

(65) Prior Publication Data
US 2022/0014212 A1     Jan. 13, 2022

(30) Foreign Application Priority Data

Nov. 26, 2018 (CN) .......................... 201811423725.6

(51) Int. Cl.
*H03M 13/11* (2006.01)
*H03M 13/00* (2006.01)

(52) U.S. Cl.
CPC ...... *H03M 13/116* (2013.01); *H03M 13/1108* (2013.01); *H03M 13/1137* (2013.01); *H03M 13/6561* (2013.01)

(58) Field of Classification Search
CPC ........... H03M 13/116; H03M 13/1108; H03M 13/1137; H03M 13/6561
See application file for complete search history.

(56) References Cited

U.S. PATENT DOCUMENTS

| 2007/0177696 A1* | 8/2007 | Chen ................. H03M 13/3905 375/341 |
| 2009/0132893 A1* | 5/2009 | Miyazaki .............. H04L 1/0066 714/776 |

(Continued)

FOREIGN PATENT DOCUMENTS

| CN | 102185615 A | 9/2011 |
| CN | 103973315 A | 8/2014 |

(Continued)

OTHER PUBLICATIONS

Huawei, et al. "Discussion on the Design of NOMA Receiver" 3GPP TSG RAN WG1 Meeting #94bis, RI-1810117, Oct. 12, 2018 (Oct. 12, 2018), Chengdu, China.

(Continued)

*Primary Examiner* — Thien Nguyen
(74) *Attorney, Agent, or Firm* — Vivacqua Crane, PLLC

(57) ABSTRACT

Provided are a decoding method, a decoding device and a decoder. The method includes: setting a decoder parallelism P, and splitting soft information of a block to be decoded according to the parallelism P; performing decoding calculation on the block to be decoded according to the split information, and outputting decoded hard bit information; and recombining the hard bit information according to the parallelism P.

17 Claims, 7 Drawing Sheets

(56) References Cited

U.S. PATENT DOCUMENTS

2016/0020787 A1* 1/2016 Ishikawa ............ H03M 13/1137
714/752
2017/0230058 A1 8/2017 Xu et al.

FOREIGN PATENT DOCUMENTS

CN 105337618 A 2/2016
EP 3364578 A1 8/2018

OTHER PUBLICATIONS

International Search Report and Written Opinion for the International Patent Application No. PCT/CN2019/117991 dated Jan. 31, 2020.
European Patent Office. Extended European Search Report for EP Application No. 19890382.5 dated Nov. 3, 2021, pp. 1-9.
Kim, Bongjin and Park, In-Cheol. Area-Efficient QC-LDPC Decoder Architecture Based on Stride Scheduling and Memory Bank Division, IEICE Transactions on Communications, vol. E96-B, Jul. 2013, pp. 1772-1779.

* cited by examiner

202: Soft information storage module

203: Forward shift module

204: Calculation module

205: Reverse shift module

206: Hard decision module

207: Hard bit information storage module

DECODING METHOD, DECODING DEVICE, AND DECODER

CROSS-REFERENCE TO RELATED APPLICATION

This application is a national stage filing under 35 U.S.C. § 371 of international application number PCT/CN2019/117991, filed Nov. 13, 2019, which claims priority to Chinese patent application No. 201811423725.6, filed Nov. 26, 2018. The contents of these applications are incorporated herein by reference in their entirety.

TECHNICAL FIELD

The present disclosure relates to, but is not limited to, the field of wireless communication, and in particular relates to a decoding method, a decoding device and a decoder.

BACKGROUND

With the continuous developments of multimedia broadcasting, wireless communication and Very Large Scale Integration (VLSI) technologies, Low Density Parity Check (LDPC) code, as the forward error correction code closest to Shannon limit, has been widely used in communication standards including, for example, Digital Video Broadcast (DVB), Wireless Local Area Network (WLAN), and Worldwide Interoperability for Microwave Access (WiMAX), and has been selected as a data channel coding scheme for enhance Mobile Broadband (eMBB) in a 5G mobile communication system. Facing the service demands for large capacity, low latency and high reliability in the future 5G (Generation) mobile communication system, as well as various application scenario demands, designing a high-performance, low-cost and flexible LDPC decoder has become a major technical challenge in the field of wireless communications.

In terms of flexibility, in a data service channel of the 5G mobile communication system, the code length of data services is flexible and changeable. The code length includes long code and short code. According to the 3GPP TS 38.212 Release15 protocol, 5G baseband channel coding adopts a Quasi Cyclic Low Density Parity Check (QC-LDPC) coding method, which needs to be compatible with up to 51 expansion factors and 2 basic matrices. This brings great difficulty to the flexible design of the LDPC decoder.

In terms of cost, the parallelism of the LDPC decoder determines resource consumption. The decoder parallelism based on a "block parallel" architecture is proportional to a supported expansion factor. In order to support the maximum expansion factor in the 5G standard, the parallelism of decoders is usually very high, leading to a large consumption of resources of a single decoder. In this way, in some application scenarios where hardware resources and costs are limited and traffic requirements are small, such as smart terminal, Internet of Things (IoT) and other scenarios, the decoder may have excessive performance, wasted hardware resources and low cost-performance. Therefore, there is a need to design an LDPC decoder with low parallelism and low resource consumption.

In terms of performance, at present, most LDPC decoders in the industry are implemented using a "block parallel" architecture based on a layered-decoding method. The peak throughput performance of decoders designed using this method and architecture scheme is limited. In an application scenario with large traffic and low latency requirements, such as wireless communication base station equipment supporting multi-cell, multi-carrier, and multi-User Equipment (UE), the decoding traffic demand may reach more than 10 Gbps. In this case, whether it is a decoder based on Digital Signal Processing (DSP), Field Programmable Gate Array (FPGA), Graphics Processing Unit (GPU) or a decoder designed by an Application Specific Integrated Circuit (ASIC) chip, the single-core processing capability of the decoder can hardly meet the system performance requirements, and multi-core parallel acceleration is required.

SUMMARY

In embodiments of the present disclosure provided are a decoding method, decoding device and decoder, to at least partially solve the problems of high hardware resource consumption and difficulty in flexible application caused by the excessive parallelism of decoders in existing technologies.

According to the embodiments of the present disclosure, a decoding method is provided, and may include steps of:
  setting a decoder parallelism P, and splitting soft information of a block to be decoded according to the parallelism P;
  performing decoding calculation on the block to be decoded according to the split information, and outputting decoded hard bit information; and
  recombining the hard bit information according to the parallelism P.

According to the embodiments of the present disclosure, a decoding device is provided, and may include:
  an information splitting module, configured to set a decoder parallelism P, and split soft information of a block to be decoded according to the parallelism P;
  a decoding module, configured to perform decoding calculation on the block to be decoded according to the split information, and output decoded hard bit information; and
  an information recombination module, configured to recombine the hard bit information according to the parallelism P.

According to the embodiments of the present disclosure, a decoder is provided, and may include a memory storing a computer program, and a processor, where the computer program, when executed by the processor, causes the processor to perform the method described above.

According to the embodiments of the present disclosure, a non-transitory computer-readable storage medium is provided. The non-transitory computer-readable storage medium stores a computer program which, when executed by a processor, causes the processor to perform the method of one of claims 1-11.

BRIEF DESCRIPTION OF DRAWINGS

The drawings described here are used to provide a further understanding of the present disclosure, and constitute a part of the present application. The illustrative embodiments of the present disclosure and their descriptions are used to explain the present disclosure and do not constitute a limitation to the present disclosure. In the drawings.

DETAILED DESCRIPTION

The present disclosure will be described in detail below by embodiments with reference to the accompanying drawings. It should be noted that the embodiments of the present disclosure and features in the embodiments may be combined with each other to derive other embodiments not explicitly described.

In a decoding method according to an embodiment of the present disclosure, the design of an LDPC decoder with variable parallelism is provided, which avoids the problems of large hardware resource consumption and difficulty in flexible application caused by excessive decoder parallelism, effectively improves the flexibility of the LDPC decoder in different scenarios, and can reduce the resource consumption of the decoder.

Figure 1:
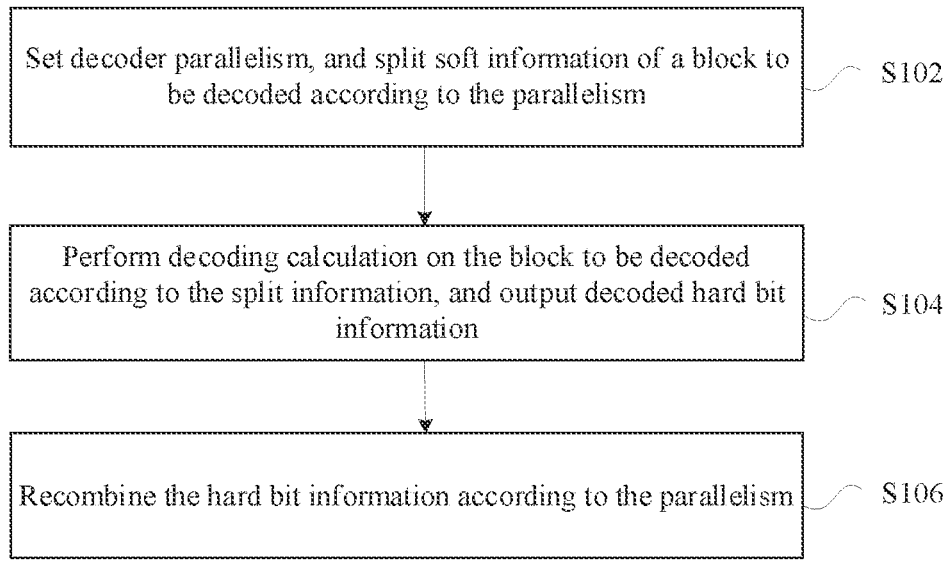
FIG. 1 is a flowchart of a decoding method according to an embodiment of the present disclosure.

FIG. 1 is a flowchart of a decoding method according to an embodiment of the present disclosure. As shown in FIG. 1, the method includes steps S102 to S106.

At step S102, a decoder parallelism P is provided, and soft information of a block to be decoded is split according to the parallelism P.

At step S104, decoding calculation is performed on the block to be decoded according to the split information, and decoded hard bit information is output.

At step S106, the hard bit information is recombined according to the parallelism P.

In the embodiment, the decoder parallelism P may be reasonably selected and set by a user according to different application scenarios, requirements of data services for decoder throughput, delay and other indexes, and according to user acceptable costs of hardware resources or chip areas, where P≤Max ($Z_{set}$), that is, P is less than or equal to the maximum expansion factor of an expansion factor set $Z_{set}$ of supported LDPC codes.

At step S102, soft information to be decoded is split. According to the parallelism P and an expansion factor Z of a code block (CB) to be decoded, the input soft information of the CB to be decoded is split according to certain rules. Information splitting is mainly to split all "block" information of size Z in one CB into T pieces of "sub-block" information. Hereinafter, the information splitting principle will be described in detail.

At step S104, decoding calculation is performed. On the basis of the method of "layered coding", the decoding calculation process further involves "time division" in the decoding calculation process of each layer, that is, "layered-time-division decoding". "Layered decoding" is to perform full parallel processing on all "block" information of size Z in the decoding calculation process of each layer, and perform serial pipeline processing on "blocks" sequentially. "Layered-time-division decoding" is to split each of the "block" information of size Z into T pieces of "sub-block" information. In the decoding calculation process of each layer, parallel processing is performed on the "sub-block" information, serial pipeline processing is performed on "sub-blocks" sequentially, and the decoding of one layer is completed in T times. That is to say, Z check rows in each layer are divided into T parts, and the decoding calculation of the Z check rows is completed in T times in a time-division mode. If T is equal to 1, each "block" information is decoded, that is, the decoding calculation of the Z check rows is completed at one time in a full parallel mode. If T is greater than 1, each "sub-block" information is decoded, that is, the calculation of the Z/T check rows is completed each time in a partial parallel mode, and the calculation of the Z check rows of one layer is completed in T times. After the decoding calculation of one layer is completed, decoding calculation of a next layer is performed.

At step S106, the decoded hard bit information is recombined. The decoded hard bit information output is recombined according to the parallelism P and the expansion factor Z of the CB to be decoded, and the recombination of the decoded hard bit information is a reverse process of the soft information splitting before decoding. Information of the hard bit "sub-blocks" is recombined into information of the hard bit "block" corresponding, and then the "block" information is output in a CB mode. Hereinafter, the information recombination principle will be described in detail.

Through the description of the embodiment, those having ordinary skills in the art can understand that the method according to the embodiment can be implemented by software in combination with a necessary general hardware platform, and of course, can also be implemented by hardware. Based on such understanding, the technical scheme of the present disclosure essentially, or a part of the technical scheme which contributes to the existing technology, may be embodied in the form of a software product.

In an embodiment of the present disclosure, a decoding device is provided. The decoding device is configured to implement the above-mentioned or other embodiments, and those that have been described will not be repeated. As used below, the term "module" can implement a combination of software and/or hardware of a predetermined function. Although the device described in the following embodiments is preferably implemented in software, hardware or a combination of software and hardware is also possible and contemplated.

Figure 2:
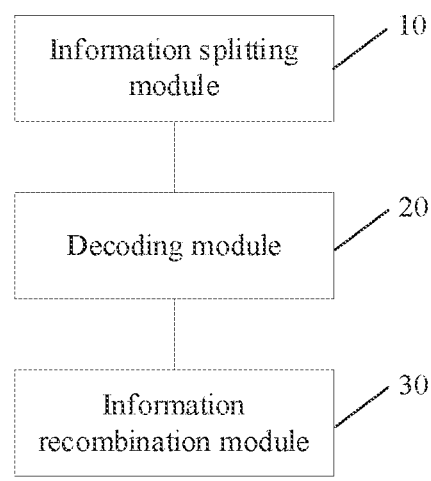
FIG. 2 is a schematic structural diagram of a decoding device according to an embodiment of the present disclosure.

FIG. 2 is a structural block diagram of a decoding device according to an embodiment of the present disclosure. As shown in FIG. 2, the decoding device includes an information splitting module 10, a decoding module 20 and an information recombination module 30.

The information splitting module 10 is configured to provide a decoder parallelism P, and split soft information of a block to be decoded according to the parallelism P.

The decoding module 20 is configured to perform decoding calculation on the block to be decoded according to the split information, and output decoded hard bit information.

The information recombination module 30 is configured to recombine the hard bit information according to the parallelism P.

It should be noted that each of the above modules may be implemented by software or hardware. In the case of hardware, the modules may be implemented by, but not limited to: the foregoing modules all being located in the same processor; or, the above modules being located in different processors in any combination.

In an embodiment of the present disclosure a decoder is further provided. The decoder includes the decoding device and some necessary storage components. The decoder may be a structured Quasi-Cyclic Low Density Parity-Check Code (QC-LDPC) decoder.

In an embodiment of the present disclosure further provided is a storage medium storing a computer program which, when executed, performs the steps in the above embodiments.

Embodiment I

The implementation process for the decoding of the present disclosure will be described in detail in combination with embodiment I. For illustration, related symbols are defined as follows:

P: hardware parallelism of the designed decoder;

$Z_{set}$: expansion factor set supported by the designed decoder;

Z: expansion factor actually adopted by the code block to be decoded, $Z \in Z_{set}$;

T: decoding time-division number of the code block to be decoded, that is, the time-division number;

t: decoding time-division index number of the code block to be decoded, $0 \le t \le T-1$;

L: number of rows or layers of the basic matrix used by the code block to be decoded;

l: decoding layer index of the code block to be decoded, $0 \le l \le L-1$;

K: number of columns of the basic matrix used by the code block to be decoded;

k: decoding column index of the code block to be decoded, $0 \le k \le K-1$;

$S_{l,k}$: shift value corresponding to the l row and k column of the basic matrix of the code block to be decoded;

$S_{l,k}^{t}$: time-division shift value corresponding to the l row, k column and t time division of the basic matrix of the code block to be decoded;

The QC-LDPC code is an important code of structured LDPC codes, of which a coding matrix is generally expressed by a basic matrix H(L×K) with L rows (layers) and K columns and an expansion factor Z. A non-"−1" element in the basic matrix is replaced by the Z-dimensional unit matrix or its cyclic shift matrix. The shift value of the cyclic shift matrix is the value of the element, and the "−1" element in the basic matrix is replaced by a Z×Z-dimensional 0 matrix. In this way, the basic matrix is expanded by using the Z×Z-dimensional "sub-matrix" to obtain a matrix H(L*Z×K*Z) with L×Z rows and K×Z columns, the expanded matrix has L layers each including Z check rows, and is used as a coding matrix of QC-LDPC codes. Similarly, decoding also uses this matrix for decoding and checking.

In this embodiment, the decoding process mainly includes information splitting, decoding calculation and information recombination. The processes are described in detail as follows:

Information Splitting:

The soft information of the CB to be decoded is $C=[B_0, B_1, B_2, \ldots, B_{K-1}]$, which contains K "blocks" $B_k$, and each "block" contains Z soft information Q, that is, $B_k=[Q_{Z*k+0}, Q_{Z*k+1}, Q_{Z*k+2}, \ldots, Q_{Z*k+Z-1}]$ and corresponds to a "sub-matrix" (or the $k^{th}$ variable node) of the $k^{th}$ column of the basic matrix H(L×K).

Before decoding, each "block" needs to be split according to the set decoder parallelism P and the expansion factor Z configured by the CB to be decoded. The point of this splitting method is that each "sub-block" obtained after the "block" is split by this splitting method still meets the cyclic shift characteristic. The "block" splitting steps include: first, the decoding time-division number T is determined, where T is the smallest positive integer that is capable of exactly dividing Z and is not less than (Z/P); and then, each "block" $B_k$ is split into T "sub-blocks" $B_k^i$, where i represents the "sub-block" index, that is:

$$B_k=\{B_k^0, B_k^1, B_k^2, \ldots, B_k^{T-1}\},$$

where each "sub-block" is represented as follows:

$$B_k^i=[Q_{Z*k+i+0*T}, Q_{Z*k+i+1*T}, Q_{Z*k+i+2*T}, \ldots, Q_{Z*k+i+(Z/T-1)*T}],$$

where $0 \le i \le T-1$, $0 \le k \le K-1$, each "sub-block" $B_k^i$ contains Z/T soft information to be decoded.

In the process of each time-division decoding of each layer, for example, the $l^{th}$ layer, for each "block" $B_k$, in each time-division decoding, a corresponding "sub-block" $B_k^i$ should be selected according to the corresponding shift value $S_{l,k}$ of the "block" in this layer to participate in the time-division decoding, and $B_k^i$ is addressed by the "sub-block" index i. The calculation rules of the index i are as follows:

the $0^{th}$ time-division decoding of the $l^{th}$ layer: i=Mod($S_{l,k}$+0, T), the $1^{st}$ time-division decoding of the $l^{th}$ layer: i=Mod($S_{l,k}$+1, T), the $2^{nd}$ time-division decoding of the $l^{th}$ layer: i=Mod($S_{l,k}$+2, T), and so on:

the $(T-1)^{th}$ time-division decoding of the $l^{th}$ layer: i=Mod($S_{l,k}$+T−1, T).

That is, the "sub-block" to be addressed in the $t^{th}$ time-division decoding of the l layer is recorded as $B_{k,t}$, $B_{k,t}$ is also called prior information, $B_{k,t}=B_k^i$, where i=Mod($S_{l,k}$+t, T), t represents the time-division index, t=0, 1, 2, ..., T−1.

Meanwhile, in the process of each time-division decoding of each layer, for example, the $l^{th}$ layer, for each "block" $B_k$, in each time-division decoding, the sub-shift value $S_{l,k}^t$ required for time-division decoding should be calculated according to the corresponding shift value $S_{l,k}$ of the "block" in this layer. The calculation rules for the sub-shift value $S_{l,k}^t$ are as follows:

the $0^{th}$ time-division decoding of the $l^{th}$ layer:

$$S_{l,k}^0 = \left\lfloor \frac{S_{l,k}+0}{T} \right\rfloor,$$

the $1^{st}$ time-division decoding of the $l^{th}$ layer:

$$S_{l,k}^1 = \left\lfloor \frac{S_{l,k}+1}{T} \right\rfloor,$$

the $2^{nd}$ time-division decoding of the $l^{th}$ layer:

$$S_{l,k}^2 = \left\lfloor \frac{S_{l,k}+2}{T} \right\rfloor,$$

and so on:

the $(T-1)^{th}$ time-division decoding of the $l^{th}$ layer:

$$S_{l,k}^{T-1} = \left\lfloor \frac{S_{l,k} + T - 1}{T} \right\rfloor.$$

That is, the sub-shift value required for the $t^{th}$ time-division decoding of the $l^{th}$ layer is $$S_{l,k}^{t} = \left\lfloor \frac{S_{l,k} + t}{T} \right\rfloor,$$

where t represents the time-division index (t=0, 1, 2, ..., T−1).

Decoding Calculation:

After completing the information splitting from "block" information to "sub-block" information, and after completing the calculation of sub-shift value to obtain $S_{l,k}^{t}$, the prior information $B_{k,t}$ is obtained by addressing, and "layered-time-division decoding" is performed on the prior information $B_{k,t}$. Taking the $t^{th}$ time-division of the $l^{th}$ layer as an example, the process of "layered-time-division decoding" is as follows:

At step 1, the prior information $B_{k,t}$ is addressed. According to the relationship i=Mod($S_{l,k}$+t, T) between the time-division index t and the "sub-block" index i, as well as the shift value $S_{l,k}$, the prior information addressing is completed, that is, $B_{k,t} = B_k^i$; and the calculation of the sub-shift value $S_{l,k}^{t}$ is completed, that is, $$S_{l,k}^{t} = \left\lfloor \frac{S_{l,k} + t}{T} \right\rfloor.$$

At step 2, positive cyclic shift is performed. Cyclic shift is performed on the prior information $B_{k,t}$ according to the sub-shift value $S_{l,k}^{t}$ to obtain the prior information $B_{k,t}'$ after cyclic shift, that is:

$$B_{k,t}' = \text{cyclic\_shift}(B_{k,t}, S_{l,k}^{t})$$

where k ∈N(l), N(l) represents the set of all indexes k of "blocks" $B_k$ participating in the decoding of the $l^{th}$ layer, that is, the set of column indexes k corresponding to all non-"−1" elements in the $l^{th}$ layer of the basic matrix H(L×K), and cyclic_shift(,) represents the positive cyclic shift function.

At step 3, variable node information $Q_{l,k}^{t}$ is calculated, which is:

$$Q_{l,k}^{t} = B_{k,t}' - \text{old\_}R_{l,k}^{t},$$

where k ∈N(l), $Q_{l,k}^{t}$ represents the $k^{th}$ variable node information in the $t^{th}$ time-division decoding of the $l^{th}$ layer, old_$R_{l,k}^{t}$ represents the $k^{th}$ old check node information in the $t^{th}$ time-division decoding of the $l^{th}$ layer, and old_$R_{l,k}^{t}$ is initialized to 0 during the first iterative decoding.

At step 4, check node information new_$R_{l,k}^{t}$ is calculated, which is:

$$\text{new\_}R_{l,k}^{t} = \underset{k' \in N(l)\backslash k}{\text{Mini\_sum}}(Q_{l,k'}^{t}),$$

where k ∈N(l), new_$R_{l,k}^{t}$ represents the $k^{th}$ new check node information in the $t^{th}$ time-division decoding of the $l^{th}$ layer, and N(l)\k represents the set of all variable node indexes k' after removing k from the set N(l).

Meanwhile, the old check node information old_$R_{l,k}^{t}$ is updated with the newly calculated check node information new_$R_{l,k}^{t}$, that is, old_$R_{l,k}^{t}$=new_$R_{l,k}^{t}$.

At step 5, posterior information new_$B_{k,t}'$ is calculated, which is:

$$\text{new\_}B_{k,t}' = Q_{l,k}^{t} + \text{new\_}R_{l,k}^{t}, \text{ where } k \in N(l).$$

At step 6, reverse cyclic shift is performed. Reverse cyclic shift is performed on the posterior information new_$B_{k,t}'$, according to the sub-shift value $S_{l,k}^{t}$ to obtain the posterior information new_$B_{k,t}$ after cyclic shift, that is:

$$\text{new\_}B_{k,t} = \text{inv\_cyclic\_shift}(\text{new\_}B_{k,t}', S_{l,k}^{t}),$$

where k∈N(l), inv_cyclic_shift (,) represents the reverse cyclic shift function.

At step 7, prior information is updated. The prior information $B_{k,t}$ is updated with the shifted posterior information new_$B_{k,t}$, so as to take the posterior information output from this iteration as the initial prior information of a next iteration, that is $B_{k,t}$=new_$B_{k,t}$, where k ∈N(l). Meanwhile, a corresponding "sub-block" $B_k^i$ is updated with $B_{k,t}$, that is, $B_k^i = B_{k,t}$, where i=Mod($S_{l,k}$+t, T).

After the above steps are completed, the decoding calculation in the $t^{th}$ time-division decoding of the $l^{th}$ layer in this decoding iteration is completed. If t<T−1, t=t+1, and the $(t+1)^{th}$ time-division calculation of the $l^{th}$ layer is continued; otherwise, the decoding calculation of the $l^{th}$ layer is completed. If l<L−1, l=l+1, and the calculation of the $(l+1)^{th}$ layer is continued; otherwise, this iterative calculation is finished, and a next iterative calculation is performed until the decoding is successful or the maximum number of iterations is reached.

After each iteration, there is a need to make a hard decision on soft information to obtain hard bit information for termination detection or decoding output. After one iteration, each soft information "sub-block" is expressed as follows:

$$B_k^i = [Q_{Z*k+i+0*T}, Q_{Z*k+i+1*T}, Q_{Z*k+i+2*T}, \ldots, Q_{Z*k+i+(Z/T-1)*T}],$$

where 0≤i≤T−1, 0≤k≤K−1, and each soft information "sub-block" $B_k^i$ contains Z/T soft information. Hard bit "sub-block" H obtained after the soft information "sub-block" B is subjected to hard decision is expressed as follows:

$$H_k^i = [S_{Z*k+i+0*T}, S_{Z*k+i+1*T}, S_{Z*k+i+2*T}, \ldots, S_{Z*k+i+(Z/T-1)*T}],$$

where hard bit information is S=sign(Q), sign( ) represents a symbolic function, 0≤i≤T−1, 0≤k≤K−1, and each hard bit "sub-block" $H_k^i$ contains Z/T hard bit information.

Information Recombination:

Information recombination is to recombine hard bit "sub-block" data obtained by hard decision into hard bit "block" data, and output all the hard bit "block" data in a hard bit CB mode. According to the time-division number T, the T hard bit "sub-block" information $H_k^i$ is recombined into hard bit "block" information $H_k$, and the information $H_k$ is expressed as follows:

$$H_k = [S_{Z*k+0}, S_{Z*k+1}, S_{Z*k+2}, \ldots, S_{Z*k+Z-1}],$$

where 0≤k≤K−L−1, that is, only the "blocks" corresponding to the first K−L information columns of the basic matrix are required to be recombined and output, and the check column information is ignored. K−L hard bit "block" information $H_k$ is combined into hard bit CB data and output, that is, hard bit CB information $C=[H_0,H_1,H_2,\ldots,H_{K-L-1}]$.

Embodiment II

Figure 3:
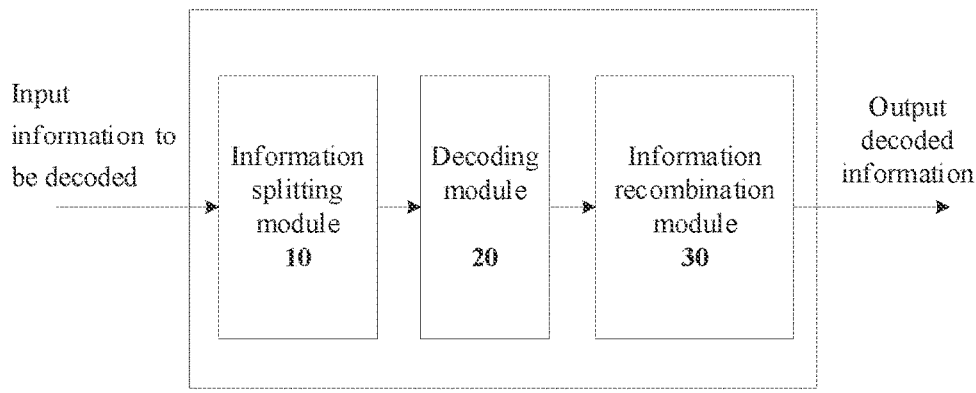
FIG. 3 is another schematic structural diagram of a decoding device according to an embodiment of the present disclosure.

In Embodiment II provided is a decoder for realizing the above decoding process. FIG. 3 is a structural block diagram of the decoder of this embodiment. As shown in FIG. 3, the decoder includes an information splitting module 10, a decoding module 20 and an information recombination module 30. The information splitting module 10 is configured to complete a soft information splitting function before decoding. The decoding module 20 is configured to complete an iterative calculation function of "layered-time-division decoding". The information recombination module 30 is configured to complete a recombination output function of decoded hard bit information. The information splitting module and the information recombination module may be located inside the decoding device or outside the decoding device.

Figure 4:
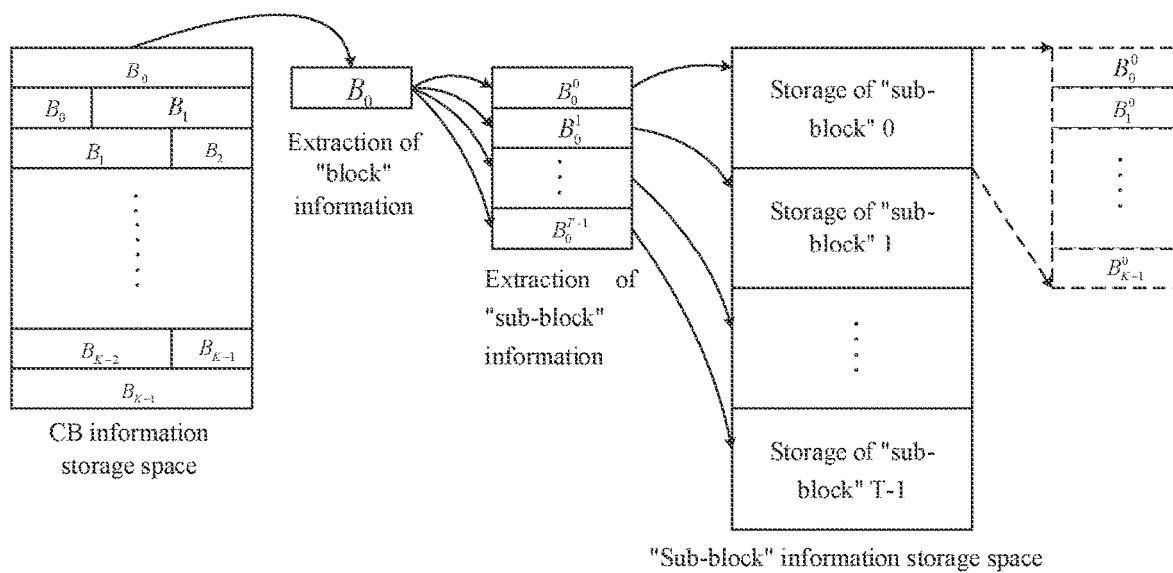
FIG. 4 is a schematic diagram showing implementation of information splitting according to an embodiment of the present disclosure.

A specific implementation of the information splitting module 10 is shown in FIG. 4. The module is configured to obtain the applicable decoding time-division number T according to the preset decoder parallelism P and the expansion factor Z of the CB to be decoded. The time-division number T may also be obtained by parameter configuration after being calculated outside the decoder. After the parameter T is obtained, all "block" information is sequentially extracted from the CB information storage space according to the expansion factor Z, and all "block" information is continuously stored in the storage space with a fixed storage bit width, so there is a need to extract the "block" information before information splitting. The whole "block" information is obtained and then split according to the time-division number T to obtain T pieces of "sub-block" information, and the T pieces of "sub-block" information are respectively stored in different address ranges of the "sub-block" information storage space according to the sub-block index number, thus splitting all the "block" information and storing "sub-block" information in sequence.

Figure 5:
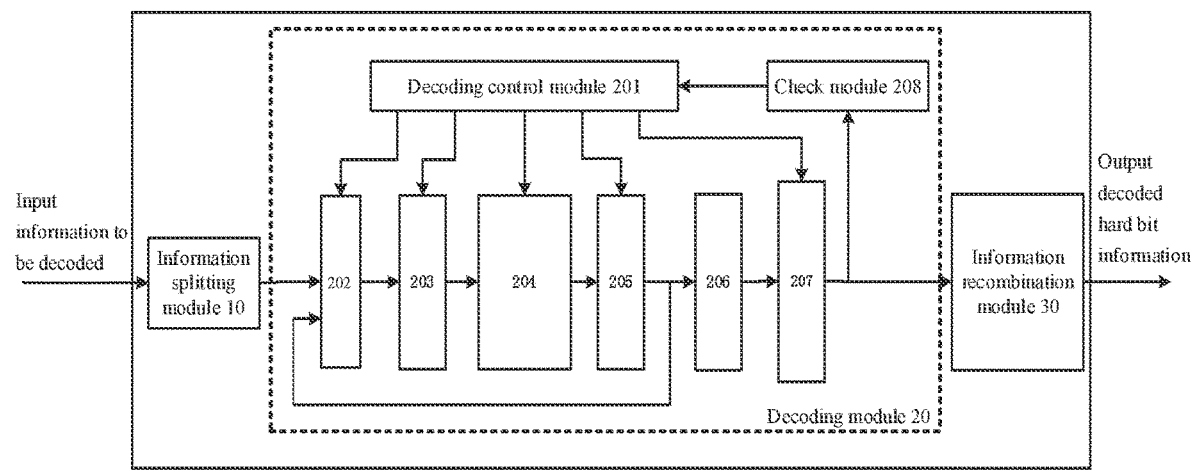
FIG. 5 is a schematic structural diagram of a decoding module according to an embodiment of the present disclosure.

An optional schematic structural diagram of the decoding module 20 is shown in FIG. 5. The decoding module 20 includes a decoding control module 201, a soft information storage module 202, a forward shift module 203, a calculation module 204, a reverse shift module 205, a hard decision module 206, a hard bit information storage module 207 and a check module 208. Each module is configured to complete the functions of storing, processing and calculating the data information input to this module according to the parameter information required by the module.

Figure 6:
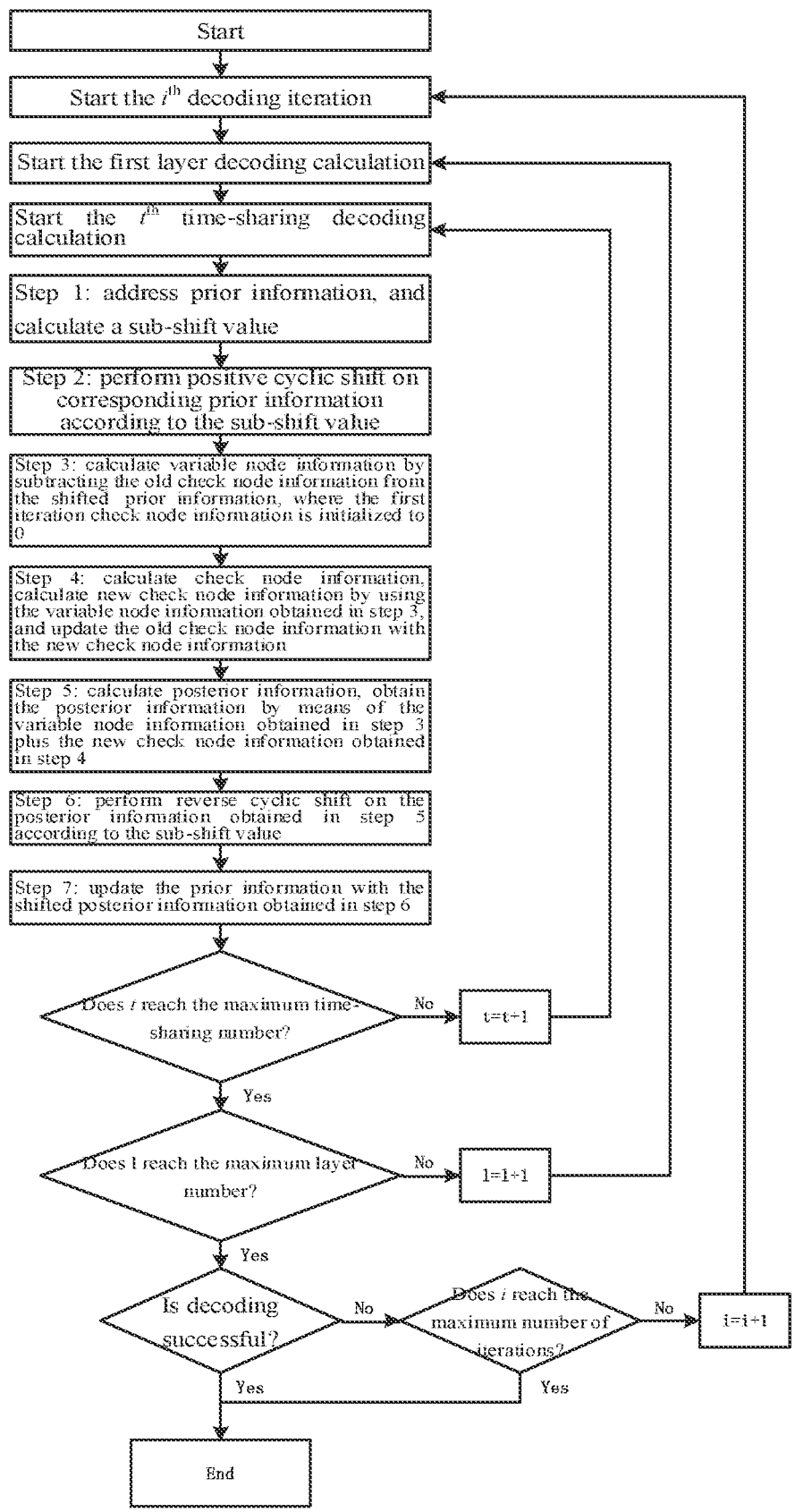
FIG. 6 is a flowchart of a decoding method according to an embodiment of the present disclosure.

FIG. 6 is a schematic diagram of a decoding flow of the decoding module. As shown in FIG. 6, the $i^{th}$ decoding iteration, the first layer decoding calculation and the $t^{th}$ time-division decoding calculation are initiated in a mode of nested loops. First, all T time-division decoding of the first layer are completed, and then, decoding calculation of the second layer is performed until decoding calculations of all the L layers are completed. Whether to end the loop is determined by judging whether the decoding is successful and the number of decoding iterations. In an embodiment, the $t^{th}$ time-division decoding calculation includes following steps.

At step 1, prior information is addressed, and a sub-shift value is calculated.

At step 2, positive cyclic shift is performed on corresponding prior information according to the sub-shift value.

At step 3, variable node information is calculated by subtracting the old check node information from the shifted prior information, where the first iteration check node information is initialized to 0.

At step 4, check node information is calculated, new check node information is calculated by using the variable node information obtained in step 3, and the old check node information is updated with the new check node information.

At step 5, posterior information is calculated, the variable node information obtained in step 3 is added to the new check node information obtained in step 4, to obtain the posterior information.

At step 6, reverse cyclic shift is performed on the posterior information obtained in step 5 according to the sub-shift value.

At step 7, the prior information is updated with the shifted posterior information obtained in step 6.

After step 7, it is judged whether the maximum time-division number T is reached, and the next time-division decoding or the first time-division decoding of the next layer is performed according to the judgment. Here, the process of the next time-division decoding or the time-division decoding of the next layer is the same as the above decoding process, and will not be repeated.

On the one hand, the soft information storage module 202 is configured to receive the new CB information to be decoded output by the information splitting module, each CB being stored in a "sub-block" information storage format after information splitting. On the other hand, the soft information storage module 202 is configured to receive the posterior information of a CB currently being decoded that is output by the reverse shift module, and store and back up the posterior information data updated every iteration. The new CB and the CB being decoded are switched in a ping-pong mode. In addition, the soft information storage module 202 is further configured to read and output the prior information to be decoded according to the read-write address information output by the control module 201, and store and update the posterior information newly calculated and output. The storage bit width of the soft information storage module 202 is determined by the preset decoder parallelism.

The forward shift module 203 and the reverse shift module 205 may be provided separately or jointly. An optional scheme is to use a QC-LDPC Shift Network (QSN). The QSN has the advantage that the cyclic shift may be performed on "sub-block" information of different sizes. The forward shift module 203 and the reverse shift module 205 are configured to perform corresponding shift and output on the input "sub-block" information to be shifted according to the shift value information input by the decoding control module 201. The forward shift module 203 and the reverse shift module 205 are configured to adopt a shift network with P input and P output according to the preset parallelism P.

Figure 7:
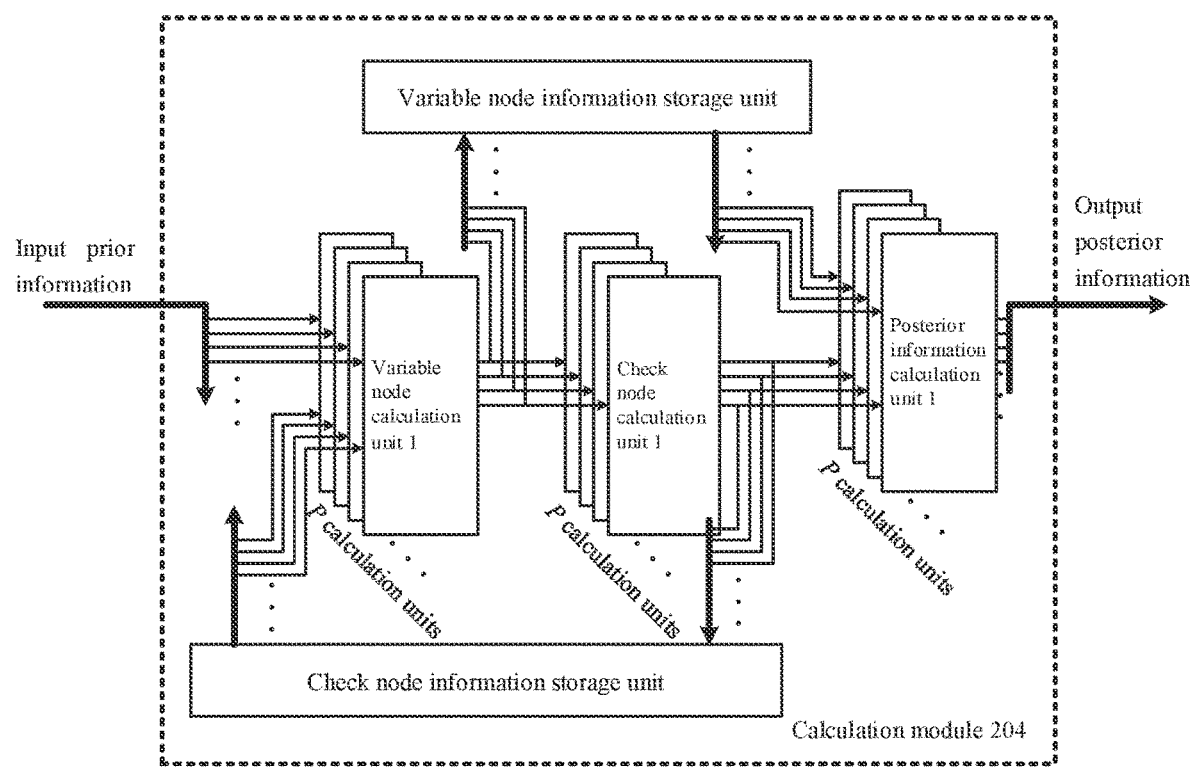
FIG. 7 is a schematic structural diagram of a calculation module according to an embodiment of the present disclosure.

The calculation module 204 is configured to calculate variable node information, check node information and posterior information according to the input prior information, output posterior information, and perform parallel calculation and storage according to the preset parallelism P. FIG. 7 is an optional schematic structural diagram of a calculation module. As shown in FIG. 7, the calculation module includes P parallel variable node calculation units, P parallel check node calculation units, P parallel posterior information calculation units, a variable node storage unit with parallelism P and a check node storage unit.

The variable node calculation unit is configured to calculate variable node information by subtracting the old check node information from the input prior information, where the old check node information is initialized to 0 in the first iterative calculation process. According to the decoder parallelism P, calculation of variable node information corresponding to each "sub-block" information is completed in parallel by using at most P variable node calculation units.

The check node calculation unit is configured to calculate corresponding new check node information according to the input variable node information, where the new check node information may be calculated by using, but not limited to, one selected from a group consisting of the Min-Sum (MS) algorithm, the normalized Min-Sum (NMS) algorithm and the Offset Min-Sum (OMS) algorithm or other algorithms. According to the decoder parallelism P, the calculation of check node information corresponding to each "sub-block" information is completed in parallel by using at most P check node calculation units.

The posterior information calculation unit is configured to calculate posterior information by the input variable node information in combination with the new check node information. According to the decoder parallelism P, calculation of posterior information corresponding to each "sub-block" information is completed in parallel by using at most P posteriori information calculation units.

The variable node information storage unit is configured to store variable node information output by the variable node calculation unit and output the corresponding variable node information to the posterior information calculation unit for the posterior information calculation. According to the decoder parallelism P, the variable node data output by at most P variable node calculation units are stored in parallel at the same address, the storage bit width is required to ensure that P variable node data may be written or read in parallel.

The check node information storage unit is configured to output corresponding old check node information to the variable node calculation unit to calculate the variable node information, where the old check node information calculated in the first decoding iteration is initialized to 0. The check node information storage unit is further configured to update the old check node information cached in the previous iteration by using the new check node information output by the check node calculation unit of this decoding iteration. According to the decoder parallelism P, the check node data output by at most P check node calculation units are stored in parallel at the same address, and the storage bit width is required to ensure that the P check node data can be written or read in parallel.

The hard decision module 206 is configured to make a hard decision on the posterior information output by the inverse shift module. The hard decision process is to make a hard decision on the posterior information expressed in the form of soft information as hard bit information. An optional implementation scheme is to perform sign function calculation on soft information, that is, use the sign bit of soft information to obtain hard bit information. According to the preset decoder parallelism P, the hard decision module supports sign calculation with parallelism P.

The hard bit information storage module 207 is configured to cache the hard decision information output from two consecutive decoding iterations. For example, the hard decision result output from this iteration is ping-pong cached with the hard decision result of the previous iteration. On the one hand, the hard decision storage module caches the hard decision result output from this iteration during this iteration, and on the other hand, outputs the hard decision result of the previous iteration to the check module and the information recombination module, respectively while performing this iterative calculation. The check module checks the hard decision result of the previous iteration, and the information recombination module caches and backs up the hard decision result of the previous iteration. If the check module passes the check, information recombination and output are performed on the hard decision result of the previous iteration; and otherwise, the cache of the hard decision result of the previous iteration is released. According to the decoder parallelism P, the storage bit width of the hard bit information storage module is P, and the depth is capable of ping-pong storing two maximum hard bit CBs.

Figure 8:
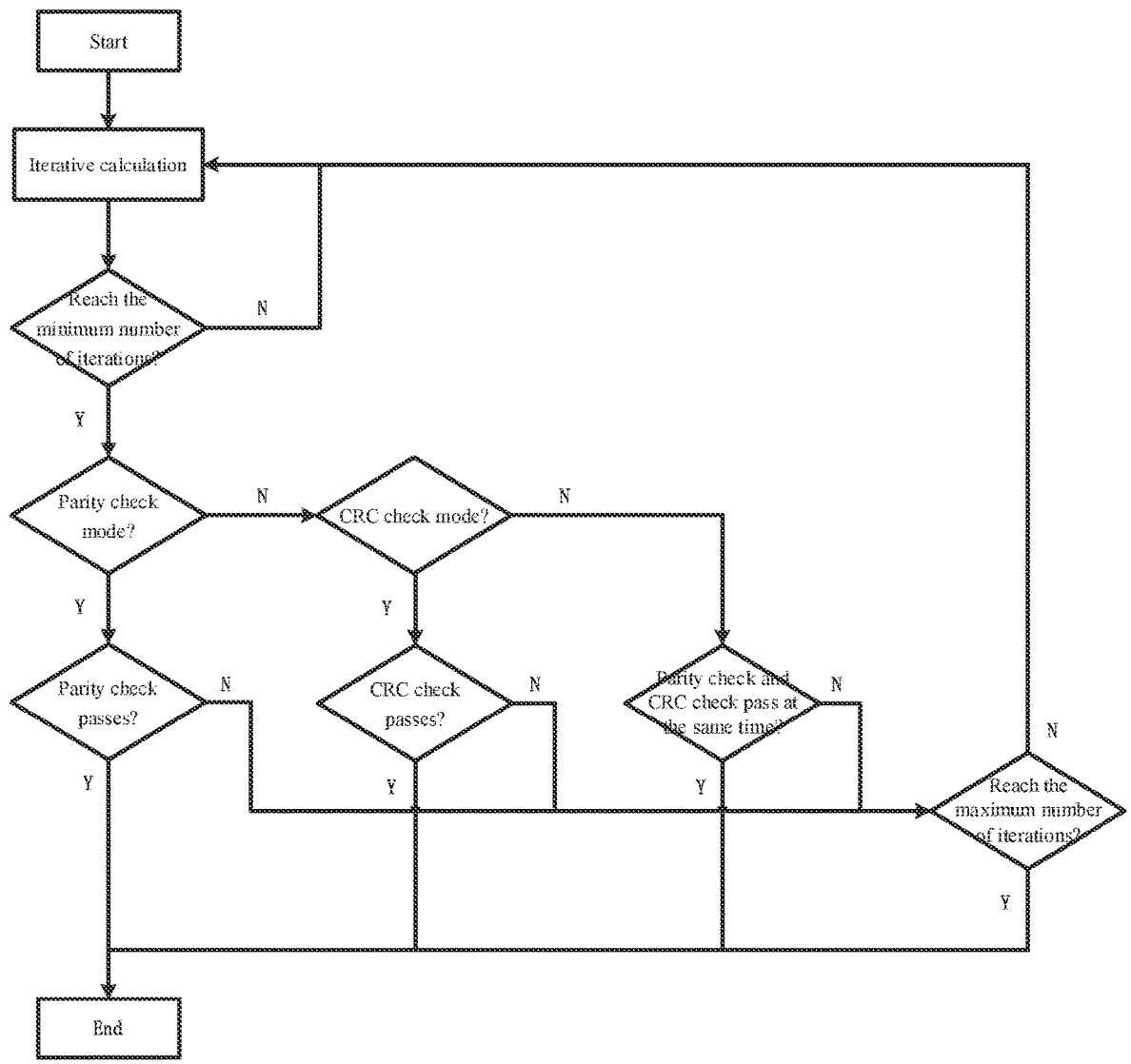
FIG. 8 is a flowchart showing check according to an embodiment of the present disclosure.

The check module 208 is configured to check the hard decision result after one iterative decoding to determine whether the condition for terminating the iterative decoding is satisfied. If the condition is satisfied, a decoding termination signal is output; otherwise, no signal is output, and the next iteration is continued. Decoding iteration termination conditions include but are not limited to the following: 1) H matrix parity check passes; 2) CRC check passes; 3) H matrix parity check and CRC check pass at the same time; 4) the minimum number of iterations is satisfied and the maximum number of iterations is reached, and so on. FIG. 8 is a flowchart showing decoding check according to an embodiment of the present disclosure.

Figure 9:
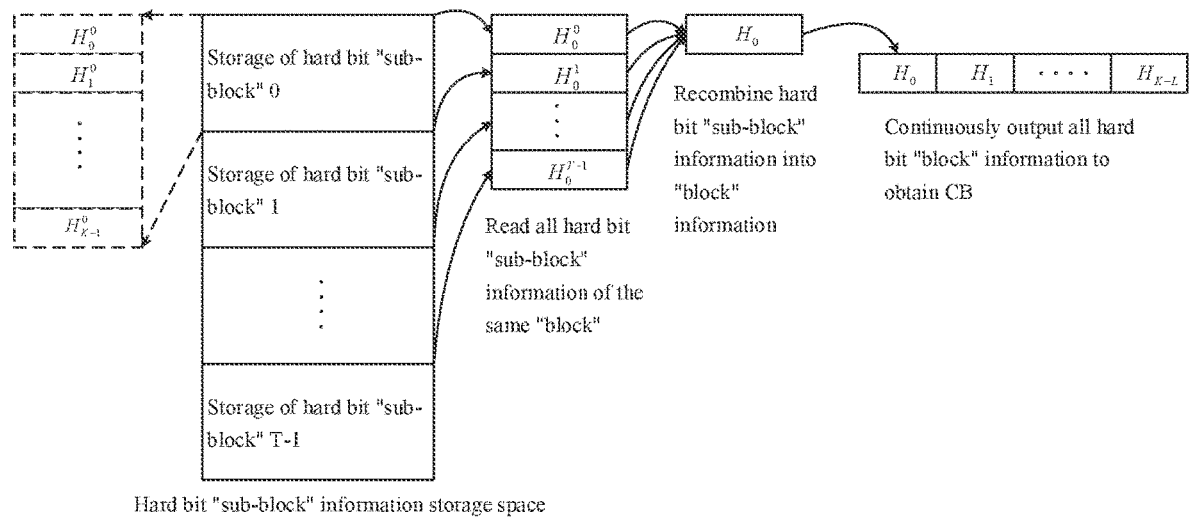
FIG. 9 is a schematic diagram showing implementation of information recombination according to an embodiment of the present disclosure.
Figure 10:
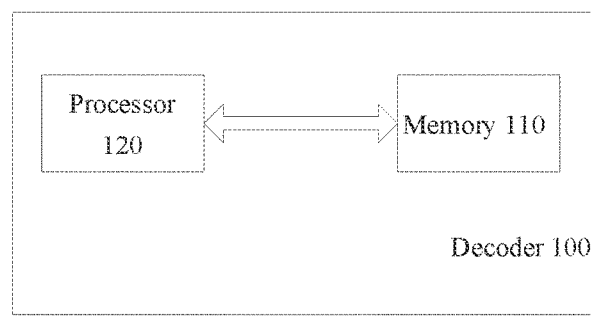
FIG. 10 is a schematic structural diagram of a decoder according to an embodiment of the present disclosure.

The information recombination module 30 is configured to calculate the applicable decoding time-division number T according to the preset decoder parallelism P and the expansion factor Z of the CB to be decoded. In an optional embodiment, the time-division number T may also be obtained by parameter configuration after being calculated outside the decoder. FIG. 9 is an optional implementation that may be used for information recombination. As shown in FIG. 9, after the recombination module obtains the parameter T, all the "sub-block" information $H_k$ belonging to the same "block" $H_k$ in the hard-bit "sub-block" information storage space are indexed and read, all the T pieces of "sub-block" information are recombined to obtain hard-bit "block" information $H_k$, the hard bit "block" information of all the first K–L representative information columns are recombined and spliced sequentially, and the final decoded results are output in a CB form.

In an embodiment of the present disclosure further provided is a decoder 100, including a memory 110 storing a computer program and a processor 120. The computer program, when executed by the processor 120 causes the processor 120 to perform the steps of the method in the above embodiments.

In an embodiment of the present disclosure further provided is a non-transitory computer-readable storage medium storing a computer program which, when executed, performs the steps of the method in the above embodiments.

In the above embodiments of the present disclosure, the flexible setting for decoder parallelism is supported, and a user can select the best parallelism to design the decoder according to the requirements of traffic, delay and the costs in the aspects of resource consumption and chip area, so as to minimize the cost on the premise of meeting the performance requirements of the decoder.

In addition, in the above embodiments of the present disclosure, the decoder is supported to be online compatible with multiple expansion factors, multiple matrices and multiple bit rates under different parallelism, and the decoder structure and resource consumption are independent of matrix size, thus improving the flexibility and compatibility of the decoder.

In the above embodiments of the present disclosure, in the decoding process, parallel processing can be performed on a single "block", serial pipeline processing can be performed on "blocks" sequentially, and all "block" information can be shared and stored without allocating storage for each "block" information independently, thus reducing the consumption of storage resources.

It will be apparent to those having ordinary skill in the art that the modules or steps of the present disclosure described above may be implemented by a general-purpose computing device, which may be centralized on a single computing device, or distributed over a network of multiple computing devices. Optionally the modules or steps may be implemented by program code executable by the computing device, such that they may be stored in a storage device and executed by the computing device. In some cases, the modules or steps shown or described may be implemented in a sequence different from that herein, or may be separately fabricated into individual integrated circuit modules, or may be fabricated into individual integrated circuit modules. Thus, the present disclosure is not limited to any particular combination of hardware and software.

The foregoing are merely some embodiments of the present disclosure and is not intended to limit the present disclosure. The embodiments of the present disclosure may be modified and varied by those having ordinary skill in the art. Any modifications, equivalent substitutions, improvements, etc. which are made within the principles of the present disclosure shall fall into the scope of the present disclosure.

What is claimed are:

1. A decoding method, comprising steps of:
setting a decoder parallelism P, and splitting soft information of all block information of size Z of a block to be decoded into T pieces of sub-block information respectively according to the parallelism P and an expansion factor Z configured by the block to be decoded, where T is a positive integer;
according to a corresponding shift value $S_{l,k}$ of the block information in the decoding layer, calculating an index i and a sub-shift value $S_{l,k}^t$ of the sub-block information, wherein:

$$i = \text{Mod}(S_{l,k} + t, T), S_{l,k}^t = \left\lfloor \frac{S_{l,k} + t}{T} \right\rfloor,$$

where t represents the time-division index, t=0, 1, 2, ... , T−1, k represents the block information number, and l represents the decoding layer number;
performing decoding calculation on the block to be decoded according to the split information, and outputting decoded hard bit information; and
recombining the hard bit information according to the parallelism P.

2. The decoding method of claim 1, wherein the step of performing decoding calculation on the block to be decoded according to the split information and outputting decoded hard bit information comprises:
performing layered-decoding calculation on the block to be decoded, wherein decoding calculation of each layer is divided into Ttime-division calculations, in each time-division calculation process, parallel processing is performed on the sub-block information, serial pipeline processing is performed on sub-blocks sequentially, and the decoded sub-block information is subjected to hard decision and hard bit sub-block information is output.

3. The decoding method of claim 2, wherein the step of recombining the hard bit information according to the parallelism P comprises:
recombining the decoded output hard bit sub-block information into corresponding hard bit block information according to the parallelism P and the expansion factor Z, and recombining the hard bit block information into hard bit decoding block and outputting the hard bit decoding block.

4. The decoding method of claim 1, wherein the parallelism P is less than or equal to the maximum expansion factor of an expansion factor set supported by the decoder.

5. The decoding method of claim 1, wherein the step of splitting all block information of size Z in the block to be decoded into T pieces of sub-block information according to the decoder parallelism P and the expansion factor Z configured by the block to be decoded comprises:
determining the decoding time-division number T according to the decoder parallelism P and the expansion factor Z configured by the block to be decoded, where T is the smallest positive integer that is capable of dividing Z evenly and is not less than Z/P; and
splitting all block information of size Z in the block to be decoded into Tpieces of sub-block information, respectively.

6. The decoding method of claim 2, wherein the step of performing layered-decoding calculation on the block to be decoded, where the decoding calculation of each layer is divided into Ttime-division calculations, in each time-division calculation process, parallel processing is performed on the sub-block information, and serial pipeline processing is performed on sub-blocks sequentially, comprises:
performing prior information addressing according to the index i of the sub-block information;
performing cyclic shift on prior information obtained by addressing according to sub-shift value of the sub-block information;
calculating variable node information, check node information and posterior information according to the prior information, and outputting the posterior information;
performing reverse cyclic shift on the posterior information according to the sub-shift value to obtain posterior information cyclic-shifted; and
updating the prior information with the shifted posterior information, and updating corresponding sub-block information with the updated prior information.

7. The decoding method of claim 6, wherein the variable node information $Q_{l,k}^t$ is calculated according to equation:

$$Q_{l,k}^t = B_{k,t} - \text{old\_}R_{l,k}^t,$$

where $k \in N(l)$, $Q_{l,k}^t$ represents the $k^{th}$ variable node information in the $t^{th}$ time-division decoding of the $l^{th}$ layer, $\text{old\_}R_{l,k}^t$ represents the $k^{th}$ old check node information in the $t^{th}$ time-division decoding of the $l^{th}$ layer, and $\text{old\_}R_{l,k}^t$ is initialized to 0 during the first iterative decoding.

8. The decoding method of claim 6, wherein the check node information $\text{new\_}R_{l,k}^t$ is calculated according to the following formula:

$$\text{new\_}R_{l,k}^t = \underset{k' \in N(l) \backslash k}{\text{Mini\_sum}}(Q_{l,k'}^t),$$

where k∈ N(l) new_$R_{l,k}^t$ represents the $k^{th}$ new check node information in the $t^{th}$ time-division decoding of the $l^{th}$ layer, and N(l)\k represents the set of all variable node indexes k' after removing k from the set N(l), and the decoding method further comprises updating the old check node information old_$R_{l,k}^t$ with the newly calculated check node information new_$R_{l,k}^t$.

9. The decoding method of claim 6, wherein the posterior information new_$B_{k,y}'$ is calculated according to the following formula:

$$\text{new\_}B_{k,t}' = Q_{l,k}^t + \text{new\_}R_{l,k}^t,$$

where $Q_{l,k}^t$ represents the $k^{th}$ variable node information in the $t^{th}$ time-division decoding of the $l^{th}$ layer.

10. A decoding device, comprising:
an information splitting module, configured to set a decoder parallelism P, and split soft information of a block to be decoded according to the parallelism P;
a decoding module, configured to perform decoding calculation on the block to be decoded according to the split information, and output decoded hard bit information; and
an information recombination module, configured to recombine the hard bit information according to the parallelism P;
wherein the information splitting module is further configured to split all block information of size Z in the block to be decoded into T pieces of sub-block information, respectively, according to the decoder parallelism P and an expansion factor Z configured by the block to be decoded, where T is a positive integer, and calculate an index i and a sub-shift value $S_{l,k}^t$ of the sub-block information according to a corresponding shift value $S_{l,k}$ of the block information in the decoding layer, wherein:

$$i = \text{Mod}(S_{l,k} + t, T), S_{l,k}^t = \left\lfloor \frac{S_{l,k} + t}{T} \right\rfloor,$$

where t represents the time-division index, t=0, 1, 2, ..., T−1, k represents the block information number, and l represents the decoding layer number.

11. The decoding device of claim 10, wherein:
the decoding module is further configured to perform layered-decoding calculation on the block to be decoded, wherein the decoding calculation of each layer is divided into T time-division calculations, in each time-division calculation process, parallel processing is performed on the sub-block information, serial pipeline processing is performed on sub-blocks sequentially, and the decoded sub-block information is subjected to hard decision and hard bit sub-block information is output; and
the information recombination module is further configured to recombine the decoded output hard bit sub-block information into corresponding hard bit block information according to the parallelism P and the expansion factor Z, and recombine the hard bit block information into hard bit decoding block information and output the hard bit decoding block.

12. The decoding device of claim 11, wherein:
the information splitting module is further configured to determine the decoding time-division number T according to the decoder parallelism P and the expansion factor Z configured by the block to be decoded, where T is the smallest positive integer that is capable of dividing Z evenly and is not less than Z/P.

13. The decoding device of claim 11, wherein the parallelism P is less than or equal to the maximum expansion factor of an expansion factor set supported by the decoder.

14. A decoder, comprising a memory storing a computer program, and a processor, wherein the computer program, when executed by the processor, causes the processor to perform a decoding method comprising steps of:
setting a decoder parallelism P, and splitting soft information of all block information of size Z of a block to be decoded into T pieces of sub-block information respectively according to the parallelism P and an expansion factor Z configured by the block to be decoded, where T is a positive integer;
according to a corresponding shift value $S_{l,k}$ of the block information in the decoding layer, calculating an index i and a sub-shift value $S_{l,k}^t$ of the sub-block information, wherein:

$$i = \text{Mod}(S_{l,k} + t, T), S_{l,k}^t = \left\lfloor \frac{S_{l,k} + t}{T} \right\rfloor,$$

where t represents the time-division index, t=0, 1, 2, ..., T−1, k represents the block information number, and l represents the decoding layer number;
performing decoding calculation on the block to be decoded according to the split information, and outputting decoded hard bit information; and
recombining the hard bit information according to the parallelism P.

15. A non-transitory computer-readable storage medium storing a computer program which, when executed by a processor, causes the processor to perform the decoding method of claim 1.

16. The decoder claim 14, wherein, the step of performing decoding calculation on the block to be decoded according to the split information and outputting decoded hard bit information comprises:
performing layered-decoding calculation on the block to be decoded, wherein decoding calculation of each layer is divided into Ttime-division calculations, in each time-division calculation process, parallel processing is performed on the sub-block information, serial pipeline processing is performed on sub-blocks sequentially, and the decoded sub-block information is subjected to hard decision and hard bit sub-block information is output.

17. The decoder of claim 16, wherein, the step of recombining the hard bit information according to the parallelism P comprises:
recombining the decoded output hard bit sub-block information into corresponding hard bit block information according to the parallelism P and the expansion factor Z, and recombining the hard bit block information into hard bit decoding block and outputting the hard bit decoding block.

* * * * *